United States Patent
Kempe

(10) Patent No.: US 6,483,301 B2
(45) Date of Patent: Nov. 19, 2002

(54) METHOD FOR COMPENSATING MECHANICAL STRESSES IN MEASURING THE MAGNETIC FIELD STRENGTH BY HALL SENSORS

(75) Inventor: Volker Kempe, Lieboch (AT)

(73) Assignee: Austria Mikro Systeme International Aktiengesellschaft, Unterpremstätten (AT)

(*) Notice: Subject to any disclaimer, the term of this patent is extended or adjusted under 35 U.S.C. 154(b) by 1 day.

(21) Appl. No.: 09/847,604

(22) Filed: May 1, 2001

(65) Prior Publication Data
US 2001/0050557 A1 Dec. 13, 2001

(30) Foreign Application Priority Data
May 3, 2000 (AT) .............................. 329/00 U

(51) Int. Cl.⁷ ...................... G01R 33/07; G01R 35/00; H01L 43/06
(52) U.S. Cl. .................. 324/225; 324/117 H; 324/202; 324/251; 338/32 H
(58) Field of Search ............................ 324/117 H, 202, 324/207.12, 207.2, 225, 235, 251; 73/DIG. 3; 323/368; 327/511; 338/32 H; 257/421, 425, 426; 360/112

(56) References Cited

U.S. PATENT DOCUMENTS

| | | | | |
|---|---|---|---|---|
| 3,886,446 A | * | 5/1975 | Laranov et al. | 324/251 |
| 4,037,150 A | * | 7/1977 | Taranov et al. | 324/251 |
| 5,406,202 A | * | 4/1995 | Mehrgardt et al. | 324/251 |
| 5,614,754 A | * | 3/1997 | Inoue | 257/421 |
| 5,686,827 A | * | 11/1997 | Ward | 323/368 |
| 6,008,643 A | * | 12/1999 | Mani et al. | 324/251 |
| 6,064,202 A | * | 5/2000 | Steiner et al. | 324/251 |
| 6,265,864 B1 | * | 7/2001 | De Winter et al. | 324/207.2 |
| 6,362,618 B1 | * | 3/2002 | Motz | 324/251 |

\* cited by examiner

Primary Examiner—Gerard R. Strecker
(74) Attorney, Agent, or Firm—Kevin E. Joyce

(57) ABSTRACT

A method for compensating mechanical stresses in measuring the magnetic field strength by Hall sensors is disclosed. It is proceeded in a manner that the electric resistance and/or a measuring quantity proportional to the electric resistance of the Hall sensor is determined in at least two different directions, that the mean value of the determined resistances and/or measuring quantities proportional thereto is calculated, and that the current conducted through the Hall sensor is chosen to be proportional to the mean value calculated.

10 Claims, 1 Drawing Sheet

METHOD FOR COMPENSATING MECHANICAL STRESSES IN MEASURING THE MAGNETIC FIELD STRENGTH BY HALL SENSORS

BACKGROUND OF THE INVENTION

1. Field of the Invention

The invention relates to a method for compensating mechanical stresses in measuring the magnetic field strength by Hall sensors.

2. Prior Art

Hall sensors, which are based on the Hall effect, usually are comprised of small plates of a semiconductor exhibiting a high carrier mobility, e.g., InSb. When a current is flowing through such plates, a magnetic-field-dependent voltage is generated perpendicular to this current and perpendicular to an existing magnetic field, which voltage is also referred to as Hall voltage. Such Hall sensors are suitable to measure the magnetic field strength within a range of between $10^{-3}$ and $10^5$ Gauss and, as a rule, are formed directly in silicon semi-conductor discs. Such Hall sensors are frequently encapsulated in synthetic or ceramic materials and, therefore, are exposed to mechanical stresses depending on external temperature influences. Such mechanical stresses, however, will alter the behavior of Hall sensors, preventing precise measurements of the magnetic field strength. Thus, the measuring sensitivity of Hall sensors is affected, in particular.

No suitable measures have so far been proposed to reduce the impact of mechanical stresses on the sensitivity of magnetic field measurements by means of Hall sensors. The proposals hitherto submitted to improve Hall sensor measurements merely aimed to compensate the offset voltage of Hall sensors.

U.S. Pat. No. 5,614,754, for instance, proposes to form a Hall sensor in the (110) plane of the semiconductor chip and, in addition, choose a ratio of the side length to the thickness of the semiconductor chip of 2:1. Thereby, the accuracy of field strength measurements is to be enhanced even at temperature and stress impacts. Furthermore, U.S. Pat. No. 5,406,202 proposes the arrangement of at least two identical Hall sensors in a relatively rotated relationship by cyclically interchanging the electric power supply and Hall voltage pickup connections and evaluating in a separate circuit the measured values determined. This also aims to compensate the offset voltage caused partially by mechanical stress. Furthermore, a circuit is known from GB-2,157,887-A, in which a Hall sensor is surrounded by an insulating wall, preferably two concentric insulating walls, intended to keep off the Hall sensor internal mechanical stresses caused, for instance, by wafer inclusions.

All of those known proposals are aimed to compensate the offset voltage of Hall sensors, i.e., an additive error of the Hall voltage. To this end, complex compensation circuits are required, which will considerably raise the power consumption of the Hall sensor. Such compensation circuits, moreover, require additional space on the chip. A compensation of changes in the sensitivity of Hall sensors caused by mechanical stress impacts cannot be taken from any of the known compensation methods.

SUMMARY OF THE INVENTION

The present invention aims to provide a method of the initially defined kind, which takes into account, in particular, sensitivity changes due to mechanical stresses and which, in addition, stands out for its particularly low current consumption, enabling also the continuous calibration of Hall sensors. Moreover, the circuitry involved as well as the chip area required are to be kept as low as possible. To solve this object, it is proceeded according to the invention in that the electric resistance and/or a measuring quantity proportional to the electric resistance of the Hall sensor is determined in at least two different directions, that the mean value of the determined resistances and/or measuring quantities proportional thereto is calculated, and that the current conducted through the Hall sensor is chosen to be proportional to the mean value calculated.

The sensitivity S of a Hall sensor with an existing magnetic field B is defined by $S = I_0 \times h(T) \times [1 + a_{PH}(\sigma)]$, wherein $I_0$ is the current conducted through the Hall sensor, $h(T)$ is the temperature-dependent Hall constant, and $a_{PH}(\sigma)$ is the stress-dependent relative change in the sensitivity of the Hall sensor which, due to the piezo-Hall effect, depends mainly on the dominant normal stress components σ11 and σ22. The following applies: $a_{PH}(\sigma) = P12 \times (\sigma11 + \sigma22) + P11 \times \sigma33$, wherein σ11, σ22 and σ33 represent the normal stress components and P12 and P11 the respective components of the piezo-Hall sensor. For the encapsulation of Hall sensors in thin plastic packages, this relative change of sensitivity usually lies below 10%.

If the current $I_0$ is conducted through a Hall sensor, the Hall voltage VH, which drops in a direction transverse to the direction of the current $I_0$, can be determined as $VH = S \times B + V_{offset}$, where B is the magnetic field component normal to the surface of the Hall sensor and $V_{offset}$ indicates the offset voltage depending, i.a., on the geometry of the Hall sensor and on piezoresistive components transverse to $I_0$. Due to the fact that, according to the invention, the current conducted through the Hall sensor is chosen to be proportional to the mean value of the electric resistances, and/or measuring quantities proportional to the electric resistances, of the Hall sensor in at least two different and, preferably, relatively orthogonal directions, an extremely efficient compensation of the mechanical stresses is obtained. The measurements of the electric resistances and/or measuring quantities proportional to the electric resistance in said different directions may be carried out at the same Hall sensor connections which are used to measure the magnetic field strength. Alternatively, the connections of an identically structured auxiliary sensor arranged in the immediate vicinity may be used as well. On account of the piezoresistive effect, the measured resistances directly depend on the mechanical stress condition of the Hall sensor such that the change in the relative sensitivity of the Hall sensor can be directly concluded from the change in the mean value of the resistances.

In a preferred manner, the method according to the invention is carried out such that, in order to determine the mean resistance, a defined current is successively conducted via two oppositely arranged connections each of the Hall sensor, or an equivalent auxiliary sensor, and the resistance is calculated from the voltage drop on said connections, it being, however, also feasible to directly use the voltage drops as measuring quantities proportional to the resistance for the formation of the mean value and subsequent adjustment of the current conducted through the Hall sensor. When measuring the voltage drop in two different, orthogonal directions, two voltages will, thus, be obtained, i.e., VAB and VCD, for the mean value of which applies: $(VAB + VCD)/2 = Iref \times R0(T) \times [1 + a_{PR}(\sigma)]$. In this respect, Iref is the measuring current conducted through the Hall sensor to determine the voltage drop, R0(T) is the temperature-dependent resistance of the Hall sensor under stress-free conditions and $a_{PR}$ ($\sigma$) is that component of the voltage-dependent relative change in the resistance of the Hall sensor, which merely depends on the normal voltage components. Due to the fact that for (100) silicon $a_{PR}$ ($\sigma$)=$-a_{PH}$ ($\sigma$) applies for a broad range of temperatures, it may be directly proceeded in a manner that the current conducted through the Hall sensor is chosen to equal the product from a temperature-dependent constant and the mean value of the voltage drop. By choosing the current conducted through the Hall sensor to be $I_0$=G(T)×(VAB+VCD)/2, the values determined for the voltage drop may be directly used, whereby the circuitry involved in the formation of the mean value and the multiplication with a constant may be kept extremely small.

In the main, the following options are, thus, available to determine the electric resistances or the measuring quantities that are proportional to the electric resistances: A constant current source is applied to the Hall sensor, whereupon the voltage drop in the direction of the current feed is measured. This may be effected either in a time window in which the field strength measurement is interrupted, or by means of an auxiliary sensor. When using an auxiliary sensor, or when using an auxiliary sensor each for the resistance measurements in a first and in a second direction, field strength measurement may be effected continuously while continuously correcting the sensitivity. The current source used to generate the Hall voltage may, of course, be used also as the constant current source. In this case, the Hall voltage and the voltage drop or resistance in one direction may be measured simultaneously on a single Hall sensor. In order to determine the resistance or voltage drop in the second direction, either the direction of the current feed must be changed in a second time window or a second Hall sensor must be employed. Finally, there is the option to use Hall sensor airs. A Hall sensor pair is composed of two Hall sensors in which the connections for the current feed and the Hall voltage pickup are arranged in a relation mutually rotated by 90°. The direct measurement of the mean resistance according to the invention also may be replaced with the measurement of the Hall voltages of at least one Hall sensor pair, one Hall sensor being fed from a constant current source and a second Hall sensor being fed from a constant voltage source, and the resistance of the Hall sensors in the two mutually orthogonal directions can be directly concluded therefrom, using Ohm's law. The use of Hall sensor pairs may again be replaced with respective successive measurements on a single Hall element.

As already mentioned, in most application cases it may preferably be proceeded in a manner that the resistances and/or measuring quantities proportional thereto are determined merely in two directions extending normal to each other. The method according to the invention may be used for Hall sensors of various types, various shapes and various dimensions. In Hall sensors having different edge lengths, the method according to the invention, however, is preferably carried out in a manner that the mean value weighted according to the respective edge length of the Hall sensor is chosen as the mean value of the resistances and/or measured quantities proportional thereto. The fact that the resistance of the Hall sensor is dependent not only on the mechanical stresses but also on their lengths in the respective measuring direction is thereby taken into account. As already pointed out, the method according to the invention sets only low demands on the compensation circuit arrangement, it being proceeded in a particularly simple manner in that the formation of the mean value with successive single measurements is realized via a sample and hold circuit. In doing so, the analog resistance and/or voltage signals are sampled at pregiven times and stored until the next sampling time. In a simple manner, the sampling times may be controlled by the same clock pulses as are used for the usually applied offset compensation of Hall sensors.

BRIEF DESCRIPTION OF THE DRAWING

In the following, the invention will be explained in more detail by way of a Hall sensor schematically illustrated in the drawing, wherein.

DETAILED DESCRIPTION OF A PREFERRED EMBODIMENT

Figure 1:
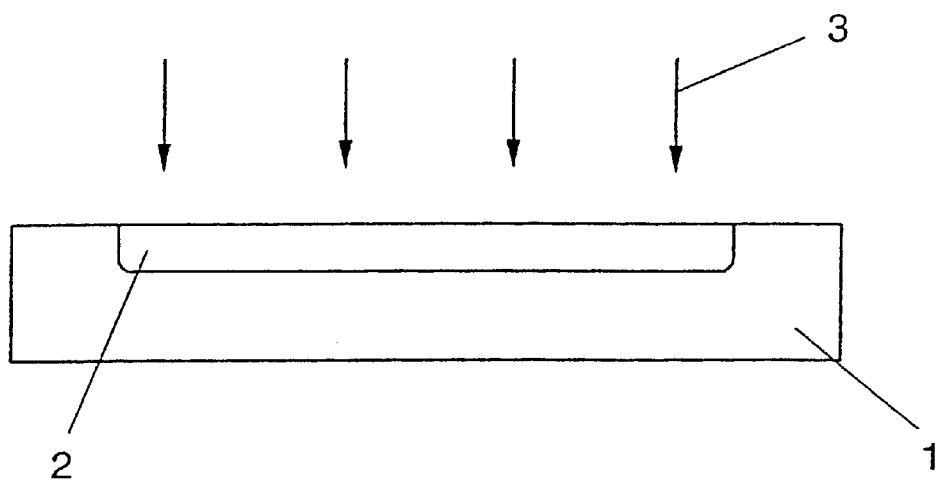
FIG. 1 is a side view of a Hall sensor.

FIG. 1 depicts a semiconductor chip 1 in which a Hall sensor 2 is formed. A magnetic field whose field strength is to be measured acts on the Hall sensor 2 in the sense of arrows 3.

Figure 2:
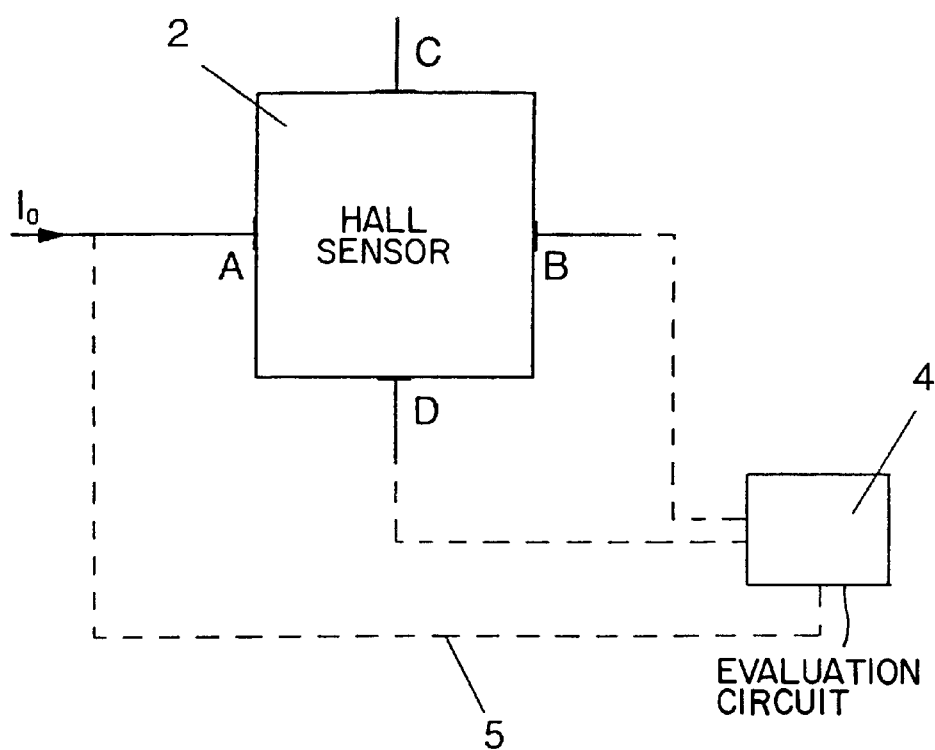
FIG. 2 is a top view on the Hall sensor according to FIG. 1.

FIG. 2 illustrates the connections A, B, C and D of the Hall sensor. To measure the magnetic field strength, a defined current $I_0$ is conducted through the Hall sensor via its connections A and B, and the voltage dropping between connections C and D is measured. Yet, the Hall voltage VCD is dependent on external stress impacts which are to be compensated by the method according to the invention. To this end, the resistance of the Hall sensor is initially measured in two opposite directions, to which end a reference current is conducted through the sensor via connections A and B and the resistance in the direction from A to B of the Hall sensor can be concluded from the voltage drop on connections A and B. In the same manner, the resistance of the Hall sensor is measured in the direction C-D, to which end a current is again conducted through the Hall sensor via connections C and D and the voltage drop is measured on connections C and D. After this, the mean value of the two resistance values determined is calculated in an evaluation circuit 4, whereby the current $I_0$ conducted through the Hall sensor during magnetic field measurement is proportionally adapted according to the calculated mean value. The respective control line is denoted by 5.

In the main, an effective compensation of stress impacts is reached in a simple manner by the method according to the invention while the additional current consumption necessary for compensation may be kept extremely low. The current required for resistance measurements is extremely low and the evaluation circuit, which is configured in a very simple manner in terms of circuitry, does not require any remarkable current quantities, either. As is immediately apparent from the above example, no additional connections are necessary on the Hall sensor for the compensation circuit and also the space required for the compensation circuit is extremely small.

What I claim is:

1. A method for compensating mechanical stresses in measuring the magnetic field strength by Hall sensors, which method comprises the steps of providing a Hall sensor including Hall sensor connection means and adapted to conduct a current therethrough, determining at least one of the electric resistance and a measuring quantity proportional to said electric resistance of said Hall sensor in at least two different directions so as to obtain determined resistances and/or determined measuring quantities proportional thereto, calculating the mean value of said determined resistances and/or determined measuring quantities proportional thereto so as to obtain a calculated mean value, and choosing said current conducted through said Hall sensor to be proportional to said calculated mean value.

2. A method as set forth in claim 1, wherein a Hall sensor comprising two respectively oppositely arranged connection means each is used and, in order to determine the mean resistance, a defined current is successively conducted via said two oppositely arranged connection means each of said Hall sensor and the mean resistance is calculated from the voltage drops on said two oppositely arranged connection means each.

3. A method as set forth in claim 1, wherein an auxiliary sensor equivalent to said Hall sensor is provided, said auxiliary sensor comprising two oppositely arranged connection means each and wherein, in order to determine the mean resistance, a defined current is successively conducted via said auxiliary sensor and the mean resistance is calculated from the voltage drops on said two oppositely arranged connection means each.

4. A method as set forth in claim 1, wherein at least one Hall sensor pair including Hall sensor pair connections is provided, said Hall sensor pair being comprised of two consecutively arranged Hall sensors having relatively orthogonal current feed, and wherein, in order to determine the mean resistance, a reference current is conducted via said at least one Hall sensor pair and the mean resistance is calculated from the voltage drops on said Hall sensor pair connection means.

5. A method as set forth in any one of claims 1 to 4, wherein the voltage drops on said Hall sensor connection means are chosen as said measuring quantities proportional to said electric resistances.

6. A method as set forth in claim 5, wherein the current conducted through said Hall sensor is chosen to be equal to the product from a temperature-dependent constant and the mean value of said voltage drops.

7. A method as set forth in claim 1, wherein said electric resistances and/or measuring quantities proportional to said electric resistances are determined in two directions extending normal to each other.

8. A method as set forth in claim 4, wherein, in order to determine the electric resistance, the Hall voltages of said at least one Hall sensor pair both with current feed and with voltage feed are used.

9. A method as set forth in claim 1, wherein said Hall sensor has a Hall sensor edge length and said calculated mean value constitutes a mean value weighted according to the respective Hall sensor edge length.

10. A method as set forth in claim 1, further comprising a sample and hold circuit for realizing the formation of said mean value.

* * * * *